US012114528B2

(12) United States Patent
Joo et al.

(10) Patent No.: US 12,114,528 B2
(45) Date of Patent: *Oct. 8, 2024

(54) DISPLAY PANEL WITH REDUCED EXTERNAL REFLECTION AND IMPROVED LIGHT EFFICIENCY

(71) Applicant: Samsung Display Co., Ltd., Yongin-Si (KR)

(72) Inventors: Sun-Kyu Joo, Suwon-si (KR); Byung-Chul Kim, Suwon-si (KR); Inok Kim, Osan-si (KR); Jaecheol Park, Hwaseong-si (KR); Jaemin Seong, Suwon-si (KR); Inseok Song, Pocheon-si (KR); Keunchan Oh, Hwaseong-si (KR); Gak Seok Lee, Hwaseong-si (KR); Jieun Jang, Suwon-si (KR); Chang-Soon Jang, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,270

(22) Filed: Sep. 13, 2022

(65) Prior Publication Data

US 2023/0006184 A1 Jan. 5, 2023

Related U.S. Application Data

(63) Continuation of application No. 16/847,506, filed on Apr. 13, 2020, now Pat. No. 11,469,403.

(30) Foreign Application Priority Data

May 16, 2019 (KR) .................. 10-2019-0057410

(51) Int. Cl.
*H10K 50/86* (2023.01)
*H10K 50/844* (2023.01)
(Continued)

(52) U.S. Cl.
CPC ......... *H10K 50/865* (2023.02); *H10K 50/844* (2023.02); *H10K 59/122* (2023.02); *H10K 59/38* (2023.02)

(58) Field of Classification Search
None
See application file for complete search history.

(56) References Cited

U.S. PATENT DOCUMENTS 9,696,835 B2   7/2017  Her
9,954,035 B2   4/2018  Yang
(Continued)

FOREIGN PATENT DOCUMENTS

CN    204271085 U    4/2015
JP    2018527623 A   9/2018
(Continued)

OTHER PUBLICATIONS

Chinese Office Action corresponding to Application No. 202010396567.0 and issued on Aug. 21, 2024, 9 pages.

*Primary Examiner* — Nduka E Ojeh
(74) *Attorney, Agent, or Firm* — Innovation Counsel LLP

(57) ABSTRACT

A display panel includes a base substrate including: a plurality of pixel regions and a peripheral region adjacent thereto; a pixel defining film disposed on the base substrate and having a plurality of openings, each of which corresponding to a respective one of the plurality of pixel regions; a plurality of light emitting elements disposed on the base substrate corresponding to the plurality of openings and configured to generate first color light; an encapsulation member disposed on the plurality of light emitting elements;

(Continued)

a light shield pattern disposed on the encapsulation member and overlapping the peripheral region when viewed in a plan view; and a light control layer disposed on the encapsulation member and the light shield pattern and overlapping the plurality of pixel regions. The pixel defining film includes a first color material, and the light shield pattern includes a second color material different form the first color.

12 Claims, 9 Drawing Sheets

(51) Int. Cl.
  *H10K 59/122* (2023.01)
  *H10K 59/38* (2023.01)

(56) References Cited

U.S. PATENT DOCUMENTS

| | | | |
|---|---|---|---|
| 10,162,222 | B2 | 12/2018 | Chae et al. |
| 11,469,403 | B2 * | 10/2022 | Joo .................. H10K 50/865 |
| 2006/0290276 | A1 | 12/2006 | Cok et al. |
| 2010/0219429 | A1 * | 9/2010 | Cok .................. H10K 50/865 |
| | | | 257/89 |
| 2015/0090991 | A1 | 4/2015 | Ishii et al. |
| 2017/0018602 | A1 * | 1/2017 | Yun .................. H10K 59/122 |
| 2017/0076678 | A1 * | 3/2017 | Lee .................. G02F 1/1336 |
| 2017/0115529 | A1 * | 4/2017 | Kim .................. G02B 6/0073 |
| 2017/0154930 | A1 * | 6/2017 | Kim .................. H10K 59/122 |
| 2018/0052347 | A1 | 2/2018 | Yu |
| 2018/0101056 | A1 * | 4/2018 | Lee .................. G02F 1/1368 |
| 2021/0208502 | A1 * | 7/2021 | Ll .................. G03F 7/0757 |
| 2021/0327979 | A1 * | 10/2021 | Kamada .................. G06V 40/1318 |

FOREIGN PATENT DOCUMENTS

| | | |
|---|---|---|
| KR | 10-2014-0119912 A | 10/2014 |
| KR | 10-2015-0020929 A | 2/2015 |
| KR | 10-1552902 B1 | 9/2015 |
| KR | 20150125207 A | 11/2015 |
| KR | 10-2017-0010262 A | 1/2017 |
| KR | 20170014043 A | 2/2017 |
| KR | 20170047635 A | 5/2017 |

* cited by examiner

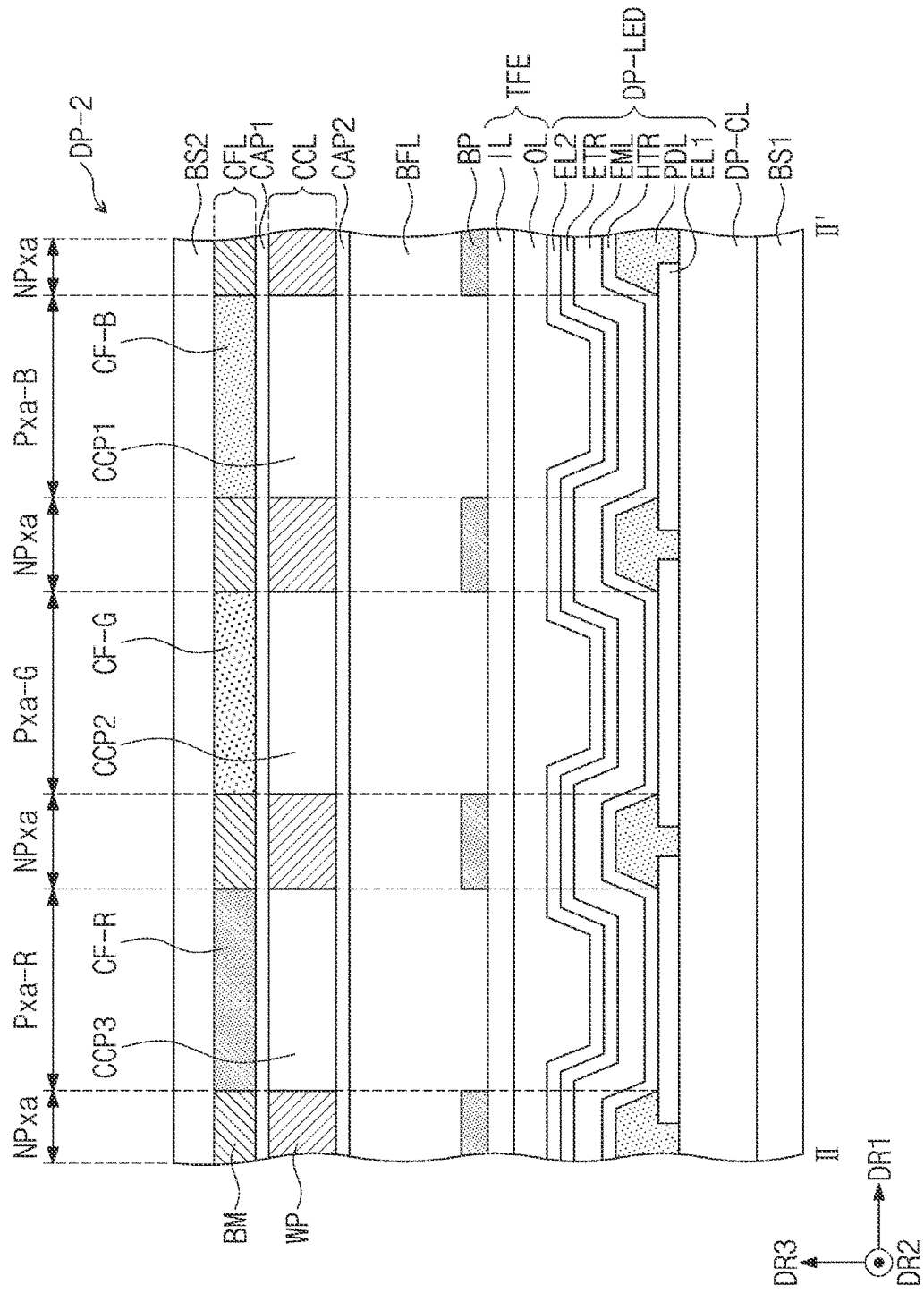

DISPLAY PANEL WITH REDUCED EXTERNAL REFLECTION AND IMPROVED LIGHT EFFICIENCY

CROSS-REFERENCE TO RELATED APPLICATION(S)

This application is a continuation application of U.S. patent application Ser. No. 16/847,506 filed on Apr. 13, 2020, which claims priority under 35 U.S.C. § 119 to Korean Patent Application No. 10-2019-0057410, filed on May 16, 2019, the disclosure of which is hereby incorporated by reference in its entirety.

BACKGROUND

The present disclosure relates to a display panel, and more particularly, to a display panel with reduced external reflection and improved light efficiency.

Display panels are largely categorized as transmissive display panels that selectively transmit source light generated from a light source and light-emitting display panels that generate source light by themselves. These display panels may include different types of color control layers according to pixels to generate color images thereon. The color control layer may transmit a selective portion of wavelength ranges of the source light or convert the color of the source light to a different color. Some of the color control layers may change the characteristics of the source light without changing the color of the source light.

SUMMARY

The present disclosure relates to a display panel, and more particularly, to a display panel with reduced external reflection and improved light efficiency.

An embodiment of the inventive concept provides a display panel including a base substrate including: a plurality of pixel regions and a peripheral region adjacent to the plurality of pixel regions; a pixel defining film disposed on the base substrate and having a plurality of openings, each of the plurality of openings corresponding to a respective one of the plurality of pixel regions; a plurality of light emitting elements disposed on the base substrate corresponding to the plurality of openings and configured to generate first color light having a first color; an encapsulation member disposed on the plurality of light emitting elements; a light shield pattern disposed on the encapsulation member and overlapping the peripheral region when viewed in a plan view; and a light control layer disposed on the encapsulation member and the light shield pattern and overlapping the plurality of pixel regions. The pixel defining film comprises a first material having the first color, and the light shield pattern includes a second material having a second color that is different form the first color.

In an embodiment, the pixel defining film may further include a black material.

In an embodiment, the first color may be a blue color, and the second color may be a red color or a green color.

In an embodiment, the light control layer may include: a first light control part that transmits the first color light; a second light control part that converts the first color light into the second color light having the second color; and a third light control part that converts the first color light into third color light having a third color that is different from the first color and the second color.

In an embodiment, the display panel may further include a color filter layer disposed on the light control layer. The plurality of pixel regions may include: a first pixel region overlapping the first light control part when viewed in the plan view; a second pixel region overlapping the second light control part when viewed in the plan view; and a third pixel region overlapping the third light control part when viewed in the plan view. The color filter layer may include: a first color filter part overlapping the first pixel region and the peripheral region when viewed in the plan view and having an opening defined therein corresponding to the second pixel region and the third pixel region; a second color filter part overlapping the second pixel region when viewed in the plan view; and a third color filter part overlapping the third pixel region when viewed in the plan view.

In an embodiment, the display panel may further include a filling layer disposed between the encapsulation member and the light control layer. The light shield pattern may be covered by the filling layer.

In an embodiment, the display panel may further include a capping layer disposed at least between the light control layer and the plurality of light emitting elements or between the light control layer and the color filter layer.

In an embodiment, the light shield pattern may include a same material as the second color filter part.

In an embodiment, the first color light may have a first wavelength range of about 410 nm to about 480 nm, the second color light may have a second wavelength range of about 500 nm to about 570 nm, and the third color light may have a third wavelength range of about 625 nm to about 675 nm.

In an embodiment, the light control layer may include: a base resin; a light emitting bodies dispersed in the base resin; and scattering bodies dispersed in the base resin.

In an embodiment, the light shield pattern may be spaced apart from the light control layer in a cross-sectional view.

In an embodiment, each of the plurality of light emitting elements may include a first electrode, a second electrode, and a light emitting layer disposed between the first electrode and the second electrode. The light emitting layer of the plurality of light emitting elements may have an integrated shape.

In an embodiment of the inventive concept, a display panel includes: a base substrate including a plurality of pixel regions and a peripheral region adjacent to the plurality of pixel regions; a pixel defining film disposed on the base substrate and having a plurality of openings corresponding to the plurality of pixel regions; a plurality of light emitting elements disposed on the base substrate corresponding to the plurality of openings; a plurality of light shield patterns disposed on the light emitting elements and overlapping the peripheral region when viewed in a plan view; and a light control layer disposed on the plurality of light shield patterns. Each of the plurality of light shield patterns includes a red color material. The pixel defining film includes a blue color material.

In an embodiment, the plurality of light emitting elements may generate blue light. The light control layer may include: a first light control part configured to transmit the blue light; a second light control part configured to convert the blue light into green light; and a third light control part configured to convert the blue light into red light.

In an embodiment, the display panel may further include a color filter layer disposed on the light control layer. The color filter layer may include: a first color filter part overlapping the first light control part when viewed in the plan view; a second color filter part overlapping the second light control part when viewed in the plan view; and a third color filter part overlapping the third light control part when viewed in the plan view.

In an embodiment, the pixel defining film may include a same material as the first color filter part.

In an embodiment, the display panel may further include an encapsulation layer disposed between the plurality of light emitting elements and the plurality of light shield patterns; and a filling layer disposed between the encapsulation layer and the light control layer. The plurality of light shield patterns may be covered by the filling layer.

In an embodiment of the inventive concept, a display panel includes: a base substrate including a plurality of pixel regions and a peripheral region adjacent to the plurality of pixel regions; a plurality of light emitting elements disposed on the base substrate and overlapping the plurality of pixel regions when viewed in a plan view and configured to generate blue light; an encapsulation member covering the plurality of light emitting elements; a light shield pattern disposed on the encapsulation member and overlapping the peripheral region when viewed in the plan view; a filling layer covering the light shield pattern; and a light control layer disposed on the filling layer and overlapping the plurality of pixel regions. The light shield pattern includes a red color material or a green color material.

In an embodiment, the display panel may further include a pixel defining film disposed on the base substrate and overlapping the peripheral region when viewed in the plan view. The pixel defining film may further include a blue color material.

In an embodiment, the pixel defining film may further include a black material.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 6 is a cross-sectional view of a display panel according to an embodiment of the inventive concept.

DETAILED DESCRIPTION

Figure 1A:
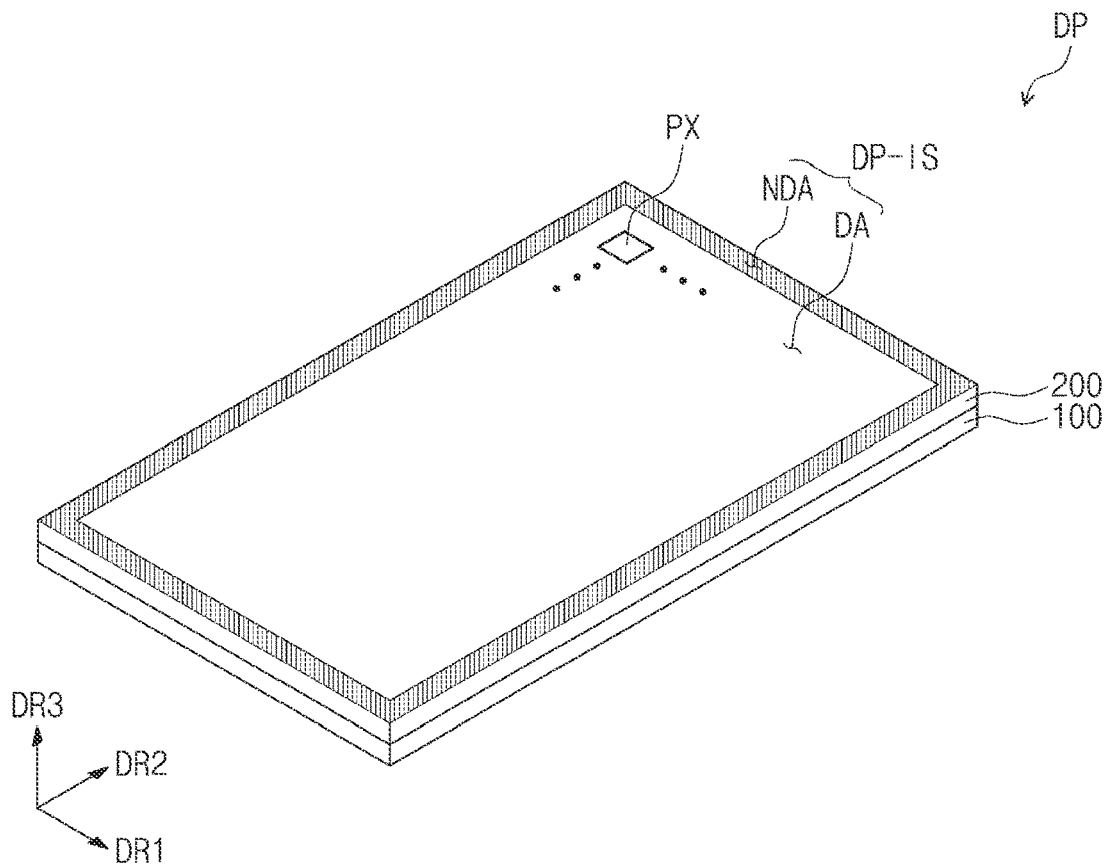
FIG. 1A is a perspective view of a display panel according to an embodiment of the inventive concept.

Preferred embodiments of the present disclosure will be described below in detail with reference to the accompanying drawings. Since the present disclosure may have diverse modified embodiments, exemplary embodiments are illustrated in the drawings and are described in the detailed description of the present disclosure. However, this does not intend to limit the present disclosure within specific embodiments, and it should be understood that the present disclosure covers various modifications, equivalents, and replacements within the idea and technical scope of the inventive concept.

Like reference numerals refer to like elements throughout the present disclosure. In the drawings, dimensions and sizes of each structure may be exaggerated, omitted, or schematically illustrated for convenience of description and clarity. It will be understood that although the terms "first" and "second" may be used herein to describe various elements, these elements should not be limited by these terms. The terms are used to distinguish one element from other elements. For example, a first element may be referred to as a second element, and the second element may similarly be referred to as the first element without departing from the scope of the present disclosure. The terms of singular forms may include plural forms unless explicitly referred to the contrary in context.

It should be further understood that, when used herein, the terms such as "include" or "have" specify the presence of features, numbers, steps, operations, elements, components, or combinations thereof, but do not exclude the likelihood of presence or addition of one or more other features, numbers, steps, operations, elements, components, or combinations thereof.

In the specification, it will be understood that, when a portion such as a layer, a film, a region, or a plate is referred to as being "on" another portion, the portion can be directly on the another portion or one or more intervening portions may also be present therebetween. On the contrary, when a portion such as a layer, a film, a region, or a plate is referred to as being "under" or "below" another portion, the portion may be "directly under" the another portion, or one or more intervening portions may also be present therebetween. In addition, the wording, disposed "on", in the present disclosure, may include not only a case of being disposed on, but also a case of being disposed under.

Meanwhile, the wording "directly contact" may mean a case in which there is no layer, film, region, or plate provided between the layer, film, region, or plate. For example, the wording "directly contact" may mean a case in which two layers or two members are disposed without an additional layer or member such as an adhesive member being disposed therebetween.

Hereinafter, a display panel according to an embodiment of the inventive concept will be described with reference to drawings.

Figure 1B:
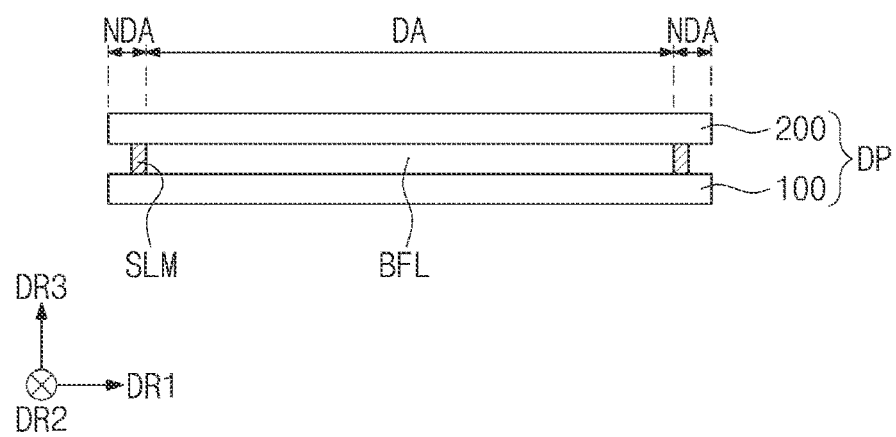
FIG. 1B is a cross-sectional view of a display panel according to an embodiment of the inventive concept.
Figure 2:
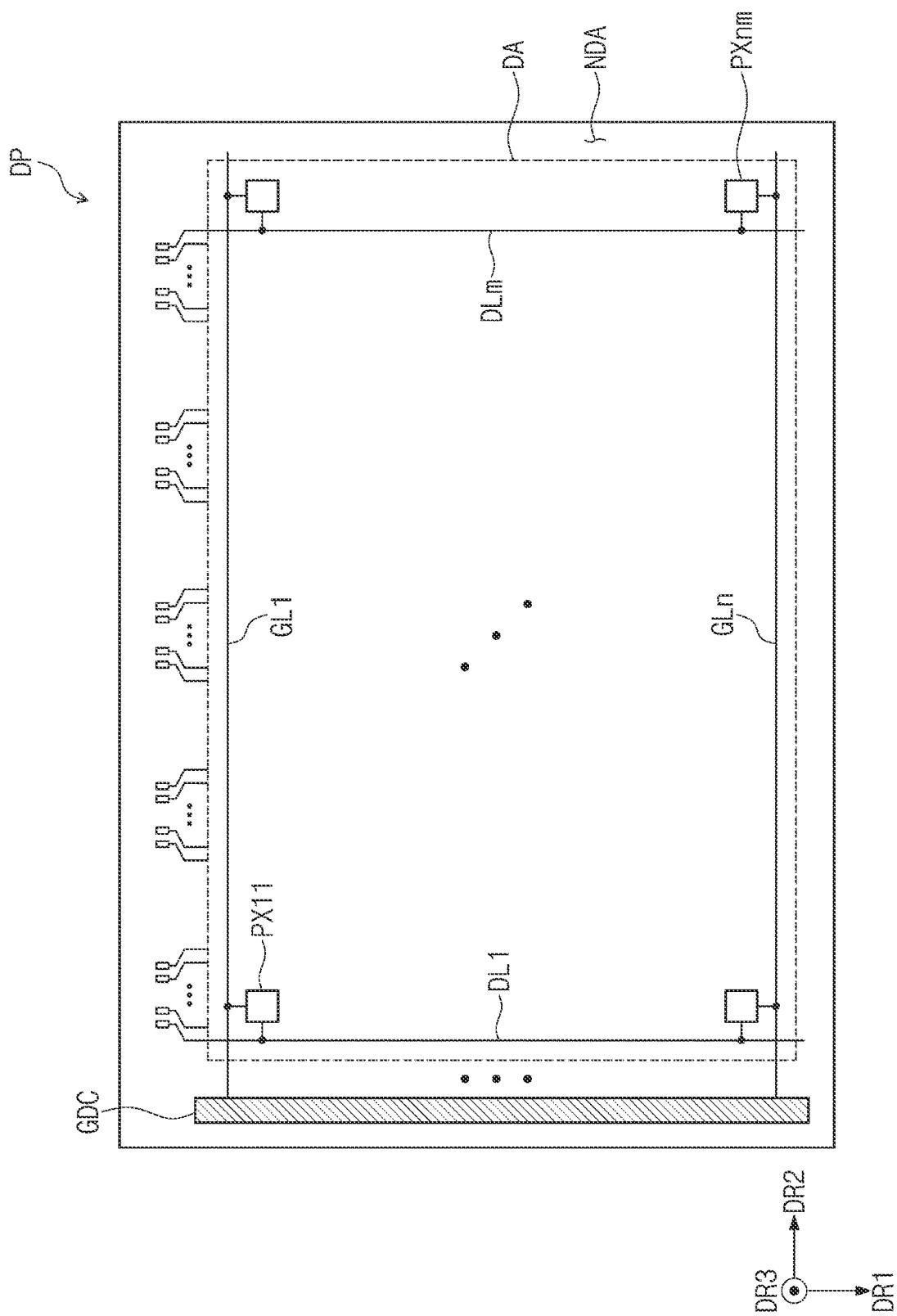
FIG. 2 is a plan view of a display panel according to an embodiment of the inventive concept.

FIG. 1A is a perspective view of a display panel according to an embodiment of the inventive concept. FIG. 1B is a cross-sectional view of a display panel according to an embodiment of the inventive concept. FIG. 2 is a plan view of a display panel according to an embodiment of the inventive concept.

Referring to FIGS. 1A to 2, a display panel DP may be any one among a liquid crystal display (LCD) panel, an electrophoretic display panel, a microelectromechanical system (MEMS) display panel, an electrowetting display panel, an organic light emitting display (OLED) panel, a micro light emitting diode (LED) display panel, a quantum dot display panel, or a quantum rod display panel, but the embodiment of the inventive concept is not particularly limited thereto.

Although not shown separately, the display panel DP may further include a chassis member and/or a molding member, and further include a backlight unit according to the type of the display panel DP.

The display panel DP may include a lower display substrate 100 or a first display substrate, and an upper display substrate 200 or a second display substrate that faces the lower display substrate 100. A filling layer BFL may be disposed between the lower display substrate 100 and the upper display substrate 200. Although not shown, in the display panel DP according to an embodiment of the inventive concept, the filling layer BFL may be omitted, and a predetermined cell gap may be defined between the lower display substrate 100 and the upper display substrate 200.

The display panel DP according to an embodiment of the inventive concept may include a sealant SLM that couples the lower display substrate 100 and the upper display substrate 200 in a non-display region NDA. The sealant SLM may include an organic adhesive member or an inorganic adhesive member. The sealant SLM may include a frit.

As shown in FIG. 1A, the display panel DP may display an image through a display surface DP-IS. The display surface DP-IS is parallel to a plane defined by a first direction DR1 and a second direction DR2. The display surface DP-IS may include a display region DA and the non-display region NDA. Pixels PX are disposed in the display region DA. The non-display region NDA may be defined along the periphery of the display surface DP-IS. The display region DA may be surrounded by the non-display region NDA.

A third direction DR3 may be defined by the normal direction of the display surface DP-IS, that is, the thickness direction of the display panel DP. Front surfaces (or upper surfaces) and rear surfaces (or lower surfaces) of each of the constituent layers or elements of the display panel DP to be described below may be distinguished in the third direction DR3. However, it is noted that the first to third directions DR1, DR2, and DR3 shown in the present embodiment are merely examples.

In an embodiment of the inventive concept, the display panel DP provided with the display surface DP-IS of a planar shape is illustrated, but the embodiment of the inventive concept is not limited thereto. The display panel DP may also include a curved display surface or a solid-type display surface. The solid-type display surface may also include a plurality of display regions that may indicate directions that are different from each other.

FIG. 2 illustrates the arrangement relationship of signal lines and pixels PX11-PXnm on a plane. The signal lines may include a plurality of gate lines GL1-GLn and a plurality of data lines DL1-DLm.

Each of the pixels PX11-PXnm is connected to a corresponding gate line among the plurality of gate lines GL1-GLn and to a corresponding data line among the plurality of data lines DL1-DLm. Each of the pixels PX11-PXnm may include a pixel drive circuit and a light emitting element. According to the configuration of the pixel derive circuit, the display panel DP may be further provided with additional signal lines in addition to the plurality of gate lines GL1-GLn and the plurality of data lines DL1-DLm.

The pixels PX11-PXnm may be arranged in a matrix form, but the embodiment of the inventive concept is not limited thereto. The pixels PX11-PXnm may be arranged in a Pentile shape or a diamond shape.

A gate driver circuit GDC may be arranged in the non-display region NDA. The gate driver circuit GDC may be integrated in the display panel DP through an oxide silicon gate (OSG) driver circuit process or an amorphous silicon gate (ASG) driver circuit process.

Figure 3A:
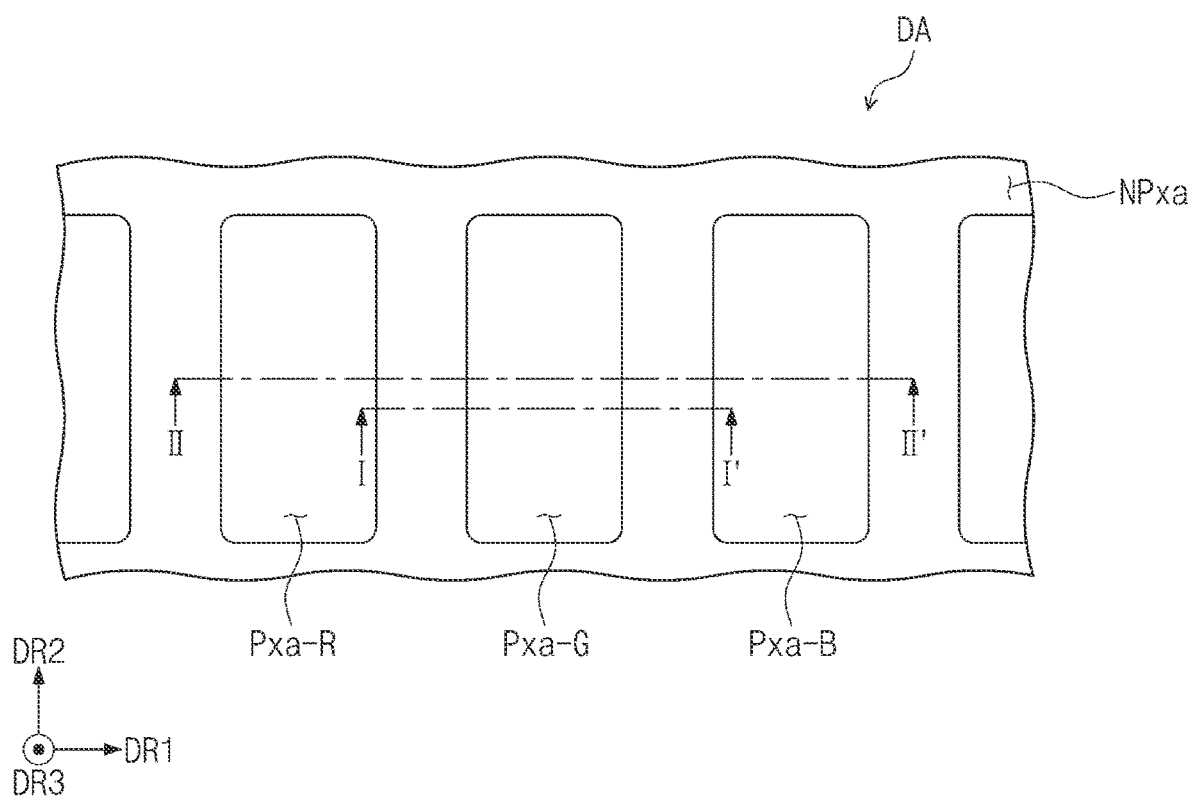
FIG. 3A is a plan view of pixel regions of a display panel according to an embodiment of the inventive concept.
Figure 3B:
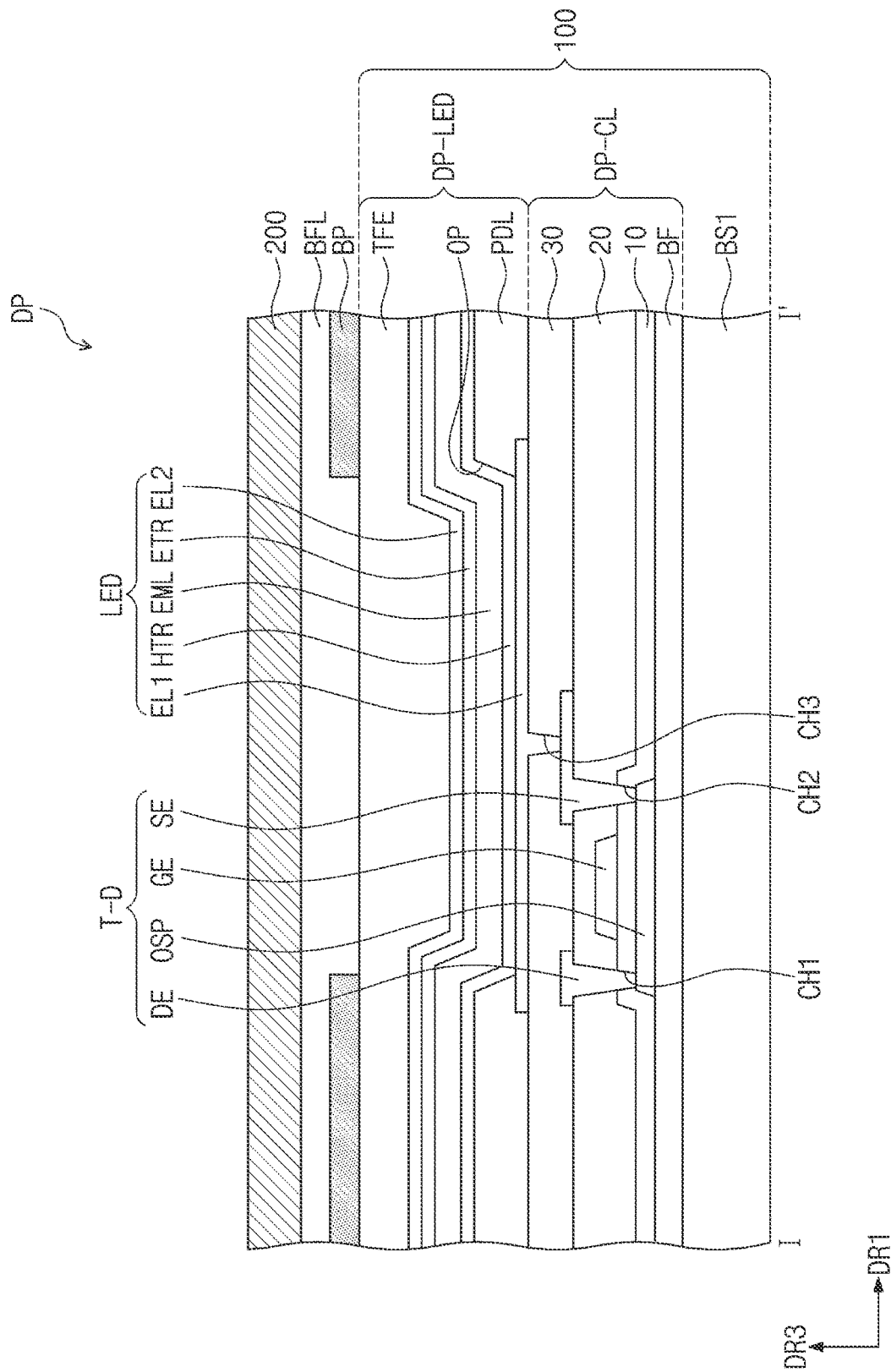
FIG. 3B is a cross-sectional view of one pixel region in a display panel according to an embodiment of the inventive concept.

FIG. 3A is a plan view of pixel regions of a display panel according to an embodiment of the inventive concept. FIG. 3B is a cross-sectional view of a pixel region in a display panel according to an embodiment of the inventive concept. FIG. 3B shows a cross-sectional surface corresponding to line I-I' of FIG. 3A.

FIG. 3A is an enlarged view of a portion of the display region DA shown in FIG. 1A. In FIG. 3A, three pixel regions Pxa-B, Pxa-G and Pxa-R are mainly shown. The three pixel regions Pxa-B, Pxa-G, and Pxa-R may be repeatedly arranged on the entirety in the display region DA.

Referring to FIG. 3A, a peripheral region NPxa is disposed around the first to third pixel regions Pxa-B, Pxa-G, and Pxa-R. The peripheral region NPxa may correspond to the boundary of the first to third pixel regions Pxa-B, Pxa-G, and Pxa-R to prevent color mixing between the first to the third pixel regions Pxa-B, Pxa-G, and Pxa-R. In addition, the peripheral region NPxa may block source light from displaying to a user on a viewing surface of the peripheral region NPxa.

In the present embodiment, the first to the third pixel regions Pxa-B, Pxa-G, and Pxa-R having the same planar area are exemplarily shown, but the embodiment of the inventive concept is not limited thereto, and the first to the third pixel regions Pxa-B, Pxa-G, and Pxa-R may have areas different from each other, or at least two or more areas may be different from each other. The first to the third pixel regions Pxa-B, Pxa-G, and Pxa-R are shown to have a rectangular shape with round corner regions when viewed in a plan view, but the embodiment of the inventive concept is not limited thereto. When viewed in a plan view, the first to the third pixel regions Pxa-B, Pxa-G, and Pxa-R may have different polygonal shapes, and the corner regions thereof may also have round polygonal shapes.

One of the first to the third pixel regions Pxa-B, Pxa-G, and Pxa-R may provide a user with first color light, another one may provide second color light that is different from the first color light, and the remaining other one may provide third color light that is different from the first color light and the second color light. In an embodiment, the first pixel region Pxa-B may provide blue light, the second pixel region Pxa-G may provide green light, and the third pixel region Pxa-R may provide red light. In the present embodiment, the source light may be the blue light that is the first color light. The source light may be generated from a light source such as a backlight, or from a display element such as a light emitting diode.

FIG. 3B shows a cross-sectional surface corresponding to the second pixel region Pxa-G of the display panel DP. FIG. 3B exemplarily shows a cross-sectional surface corresponding to a driver transistor and a light emitting element LED. In FIG. 3B, an upper display substrate 200 is simply illustrated.

As shown in FIG. 3B, the display panel DP may include a first base substrate BS1, a circuit element layer DP-CL disposed on the first base substrate BS1, and a display element layer DP-LED disposed on the circuit element layer DP-CL.

The first base substrate BS1 may include a synthetic resin substrate or a glass substrate. The circuit element layer DP-CL may include at least one insulating layer and a circuit element. The circuit element may include a signal line, a driver circuit for pixels, and the like. The circuit element layer DP-CL may be formed through: a process for forming an insulating layer, a semiconductor layer and a conductive layer by coating, deposition, etc.; and a process for patterning the insulating layer, the semiconductor layer and the conductive layer such as a photolithography process.

In the present embodiment, the circuit element layer DP-CL may include a buffer film BF, a first insulating layer 10, a second insulating layer 20, and a third insulating layer 30. Each of the first insulating layer 10 and the second insulating layer 20 may be an inorganic film, and the third insulating layer 30 may be an organic film. In one embodiment, the third insulating layer 30 may include polyimide (PI).

FIG. 3B exemplarily shows the arrangement relationship between a semiconductor pattern OSP, a control electrode GE, an input electrode DE, and an output electrode SE. First, second, and third through-holes CH1, CH2, and CH3 are also exemplarily shown.

The display element layer DP-LED includes a light emitting element LED. The light emitting element LED may generate the abovementioned source light. The source light generated by the light emitting element LED may be blue light. The light emitting element LED includes a first electrode EL1, a second electrode EL2, and a light emitting layer EML disposed therebetween. In the present embodiment, the light emitting element LED may include an organic light emitting diode. However, the embodiment of the inventive concept is not limited thereto, and the light emitting element LED included in the display element layer DP-LED may be various display elements, such as LCDs, LEDs, micro-LEDs, quantum dots, or quantum rods as unlimiting and nonrestrictive examples.

The display element layer DP-LED includes a pixel defining film PDL. An opening OP corresponding to the second pixel region Pxa-G is defined in the pixel defining film PDL. Although not shown in FIG. 3B, in the pixel defining film PDL, a plurality of openings corresponding to the respective first to third pixel regions Pxa-B, Pxa-G, and Pxa-R may be defined.

The pixel defining film PDL may include a blue material. In an embodiment, the light emitting element LED may generate first color light, and the pixel defining film PDL may include a first color material corresponding to the light generated by the light emitting element LED. The light emitting element LED may generate blue light, and the pixel defining film PDL may include a blue material. The pixel defining film PDL may include the same material as a first color filter part CF-B to be described later. For example, the pixel defining film PDL may include a blue organic material.

According to one embodiment, the pixel defining film PDL may further include a black material. For example, the pixel defining film PDL may include a black organic dye/pigment such as carbon black or aniline black. According to one embodiment, the pixel defining film PDL may be formed by mixing a blue organic material and a black organic material. The pixel defining film PDL may further include a liquid-repellent organic material.

In the display panel DP, according to an embodiment, the first electrode EL1 may be disposed on the third insulating layer 30. The first electrode EL1 may be connected to the output electrode SE via a third through-hole CH3 that passes through the third insulating layer 30. FIG. 3B exemplarily illustrates that the first electrode EL1 is disposed on the third insulating layer 30, but the embodiment of the inventive concept is not limited thereto, and the first electrode EL1 may be disposed to be embedded in the third insulating layer 30 and expose the upper surface thereof. In this case, the upper surface of the first electrode EL1 and the upper surface of the third insulating layer 30 may form the same plane.

The opening OP of the pixel defining film PDL may expose at least a portion of the first electrode EL1. When viewed in a plan view, the pixel defining film PDL may overlap at least a portion of the first electrode EL1. Specifically, when viewed in a plan view, the pixel defining film PDL may overlap an outer peripheral portion of the first electrode EL1.

On the first electrode EL1, a hole transport region HTR, the light emitting layer EML, an electron transport region ETR may sequentially be disposed. The hole transport region HTR, the light emitting layer EML, and the electron transport region ETR may sequentially be disposed on the first electrode EL1 and the pixel defining film PDL. The hole transport region HTR, the light emitting layer EML, and the electron transport region ETR may be commonly disposed in the first to third pixel regions Pxa-B, Pxa-G, and Pxa-R. However, the embodiment of the inventive concept is not limited thereto, and the hole transport region HTR, the light emitting layer EML, and the electron transport region ETR may be patterned and disposed only inside the opening OP of the pixel defining film PDL.

The hole transport region HTR may include at least any one of a hole injection layer, a hole transport layer, a hole buffer layer, or an electron barrier layer.

The hole transport region HTR may have a single layer structure formed of a single material, a single layer structure formed of a mixture of a plurality of materials that is different from each other, or a multilayer structure including a plurality of layers formed of a plurality of materials that is different from each other.

For example, the hole transport region HTR may have a single layer structure of the hole injection layer or the hole transport layer, and also have a single layer structure formed of a mixture of a hole injection material and a hole transport material. In addition, the hole transport region HTR may have a single layer structure formed of a mixture of a plurality of materials that is different from each other, or a structure sequentially stacked on the first electrode EL1 and including hole injection layer/hole transport layer, hole injection layer/hole transport layer/hole buffer layer, hole injection layer/hole buffer layer, hole transport layer/hole buffer layer, hole injection layer/electron barrier layer, or hole transport layer/electron barrier layer, but the embodiment of the inventive concept is not limited thereto.

The light emitting layer EML may generate blue light, and the blue light may have a wavelength of approximately 410-480 nm. The light emitting spectrum of the blue light may have a maximum peak within approximately 440-460 nm. The light emitting layer EML may have a tandem structure of one or more single layer structures.

The light emitting layer EML may include, as a light emitting material, a low molecular-weight organic material, or a polymer organic material. Alternatively, the light emitting layer EML may include a quantum dot material as a light emitting material. A core of the quantum dot may be selected from among group II-VI compounds, group III-V compounds, group IV-VI compounds, group IV elements, group IV compounds, or any combination thereof.

The electron transport region ETR is disposed on the light emitting layer EML. The electron transport region ETR may include at least one among a hole barrier layer, an electron transport layer, and an electron injection layer, but the embodiment of the inventive concept is not limited thereto.

The electron transport region ETR may have a single layer formed of a single material, a single layer structure formed of a mixture of a plurality of materials that is different from each other, or a multilayer structure including a plurality of layers formed of a plurality of materials that is different from each other. For example, the electron transport region ETR may have a single layer structure of an electron injection layer or an electron transport layer, and also have a single layer structure formed of an electron injection material and an electron transport material. In addition, the electron transport region ETR may have a single layer structure formed of a plurality of mutually different materials, or may have a structure sequentially stacked on the light emitting layer EML and including electron transport layer/electron injection layer, or electron barrier layer/electron transport layer/electron injection layer, but the embodiment of the inventive concept is not limited thereto.

The second electrode EL2 is disposed on the electron transport region ETR. The second electrode EL2 may be commonly disposed in the first to third pixel regions Pxa-B, Pxa-G, and Pxa-R (see FIG. 3A). The second electrode EL2 may have a larger area than that of the first electrode ELL The second electrode EL2 has conductivity. The second electrode EL2 may be formed of a metal alloy or a conductive compound. The second electrode EL2 may be a cathode. In this case, the first electrode EL1 may be an anode. The second electrode EL2 may be a transmissive electrode, a semi-transmissive electrode, or a reflective electrode.

Although not shown, the second electrode EL2 may be connected to an auxiliary electrode. When the second electrode EL2 is connected to the auxiliary electrode, the resistance of the second electrode EL2 may be reduced.

An encapsulation member TFE may be disposed on the light emitting element LED and encapsulate the light emitting element LED. The encapsulation member TFE may include an inorganic film disposed on the outermost periphery thereof. The encapsulation member TFE may further include an organic film, or have a structure in which inorganic films and organic films are alternately repeated. The encapsulation member TFE may protect the light emitting element LED from water/oxygen and foreign substances.

In an embodiment, the inorganic film of the encapsulation member TFE may include a material that protects the light emitting element LED thereunder without particular limitation. For example, the inorganic film may include silicon nitride ($SiN_x$), silicon oxynitride ($SiO_yN_x$), silicon oxide ($SiO_y$), titanium oxide ($TiO_y$), aluminum oxide ($AlO_y$), or the like.

The organic film of the encapsulation member TFE may include a material having a predetermined thickness and flattening the upper portion of the light emitting element LED without particular limitation. For example, the organic film may include an organic material based on acrylate. The inorganic film may be formed through a deposition method or the like, and the organic film may be formed through a deposition method, coating method, or the like.

A light shield pattern BP may be disposed on the encapsulation member TFE. The light shield pattern BP may be disposed without overlapping the first to third pixel regions Pxa-B, Pxa-G, and Pxa-R while overlapping the peripheral regions NPxa when viewed in a plan view. The light shield pattern BP may be patterned to overlap each of the peripheral regions NPxa.

The light shield pattern BP includes a material having a predetermined color. In an embodiment, the light emitting element LED generates first color light, and the light shield pattern BP includes a material having a second color that is different from the first color. For example, the light emitting element LED generates blue light, and the light shield pattern BP may include a material of a red or green color. The light shield pattern BP may include the same material as a third color filter part CF-R to be described later. The light shield pattern BP may include a red organic material.

The filling layer BFL may be disposed on the light shield pattern BP. The filling layer BFL is disposed between the lower display substrate 100 and the upper display substrate 200, prevents the substance of components included in a layer of the upper display substrate 200 such as a light control layer from coming into contact with the encapsulation member TFE of the lower display substrate 100. The filling layer BFL may improve the light extraction efficiency of the display panel DP. The filling layer BFL may be disposed to cover the entirety of the light shield pattern BP. The filling layer BFL may cover an upper surface and a side surface of the light shield pattern BP that are exposed as well as the exposed upper surface of the encapsulation member TFE in a region in which the light shield pattern BP is not disposed.

FIG. 3B exemplarily illustrates that the filling layer BFL is disposed between the lower display substrate 100 and the upper display substrate 200, but the embodiment of the inventive concept is not limited thereto, and the filling layer BFL may be omitted in the display panel DP according to an embodiment of the inventive concept. In this case, a predetermined cell gap may be maintained between the lower display substrate 100 and the upper display substrate 200.

The display panel DP according to an embodiment of the inventive concept includes the light shield pattern BP disposed on the encapsulation member TFE, and the light shield pattern BP includes a material having a color different from that of the light generated by the light emitting element LED. According to one embodiment, the light emitting element LED of the display panel DP according to an embodiment of the inventive concept generates blue light, and the light shield pattern BP disposed to overlap a peripheral region on the encapsulation member TFE may include a red or green organic material. Through this arrangement, color mixing between the adjacent pixel regions may efficiently be prevented. In addition, as the light shield pattern BP may be formed by colored organic materials, re-reflection of light inside the display panel DP may be prevented compared to that an arrangement in which the light shield pattern BP is formed by a reflective material such as metal, and thus, the external light reflectivity of the display panel DP may be reduced, and light extraction efficiency toward the outside may be enhanced.

In addition, in the pixel defining film PDL included in the display panel DP according to an embodiment of the inventive concept, the pixel defining film PDL may include a material having the same color as the color of the light generated by the light emitting element LED. According to one embodiment, the light emitting element LED may generate blue light, and the pixel defining film PDL may include a blue color material. Through this arrangement, the effect of reducing the external light reflectivity may further be enhanced.

Figure 4A:
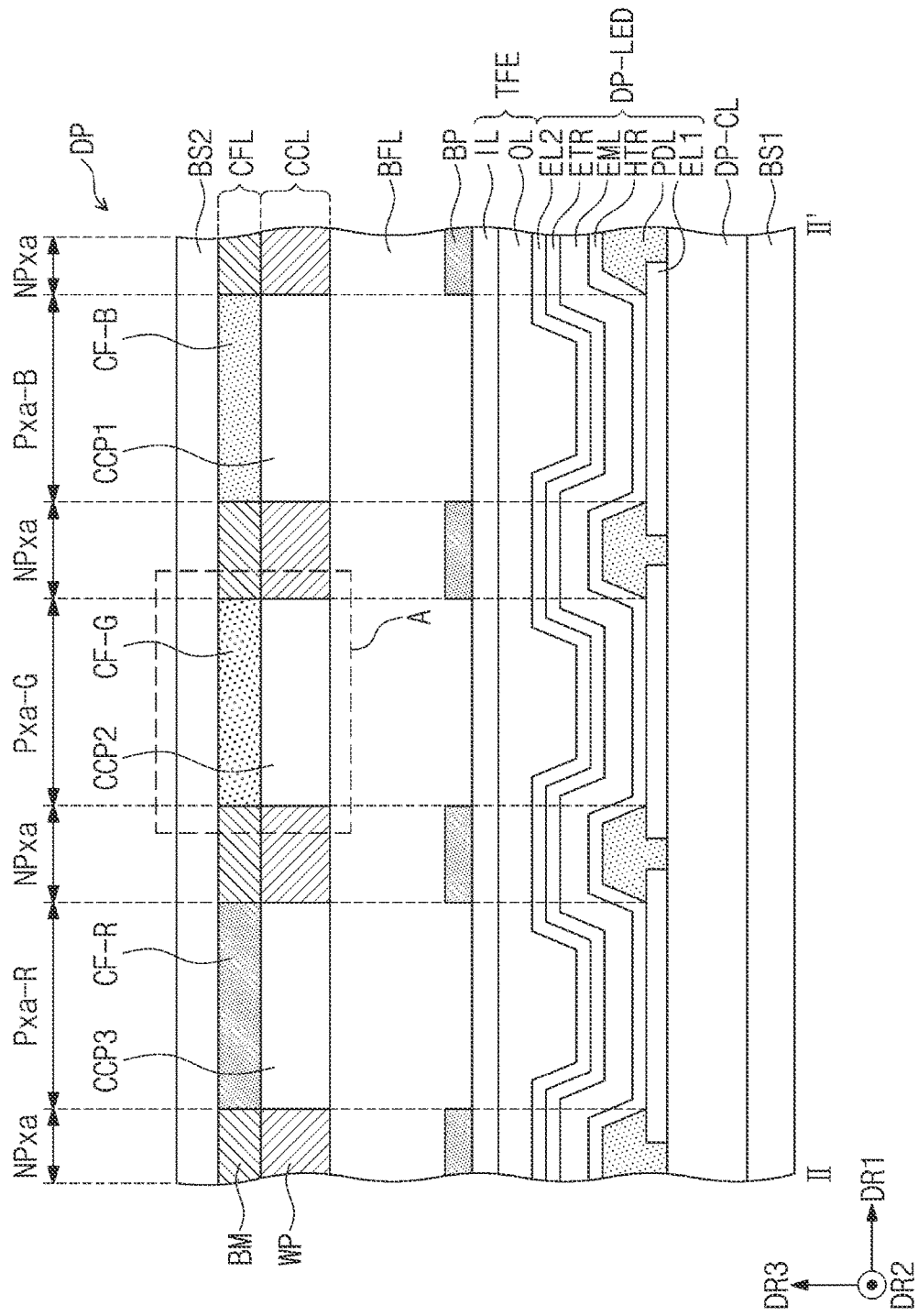
FIG. 4A is a cross-sectional view illustrating a display panel according to an embodiment of the inventive concept.
Figure 4B:
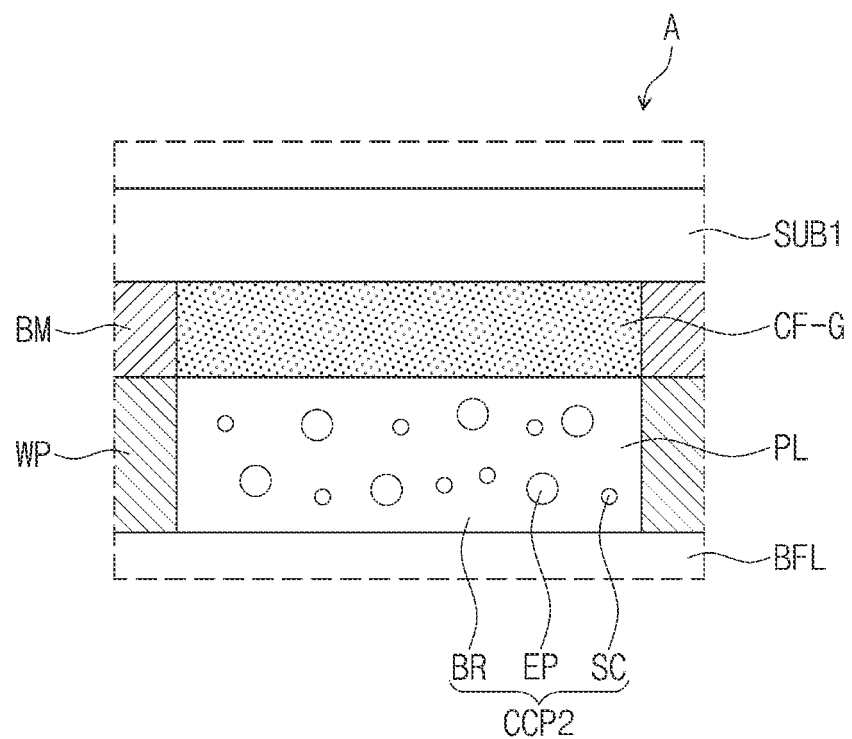
FIG. 4B is an enlarged cross-sectional view of a portion of a cross-section in a display panel according to an embodiment of the inventive concept.

FIG. 4A is a cross-sectional view of a display panel according to an embodiment of the inventive concept. FIG. 4B is an enlarged cross-sectional view of a portion of a cross-section in a display panel according to an embodiment of the inventive concept. Specifically, FIG. 4A is a cross-sectional view taken along line II-II' of FIG. 3A, and FIG. 4B is a cross-sectional view corresponding to region A of FIG. 4A.

Referring to FIGS. 4A and 4B, the display panel DP according to an embodiment of the inventive concept includes: the circuit element layer DP-CL disposed on the first base substrate BS1; the display element layer DP-LED disposed on the circuit element layer DP-CL; the encapsulation member TFE disposed on the display element layer DP-LED; and the filling layer BFL disposed on the encapsulation member TFE. The upper display substrate 200 (see FIG. 3A) of the display panel DP may include: a second base substrate BS2; a color filter layer CFL disposed under the second base substrate BS2; and a light control layer CCL disposed under the color filter layer CFL.

In an embodiment, the display panel DP may include a first light emitting element overlapping the first pixel region Pxa-B; a second light emitting element overlapping the second pixel region Pxa-G; and a third light emitting element overlapping the third pixel region Pxa-R.

Each of the first to third light emitting elements may include a first electrode EL1, a hole transport region HTR, a light emitting layer EML, an electron transport region ETR, and a second electrode EL2 that are sequentially stacked.

The light emitting layers EML of the first to third light emitting elements may have an integrated shape, and may be commonly disposed in the pixel regions Pxa-B, Pxa-G, and Pxa-R and a peripheral region NPxa. The light-emitting layer EML may generate first color light. For example, the light emitting layer EML may generate blue light. Although not shown separately, in an embodiment of the inventive concept, the light emitting elements corresponding to the first to third pixel regions Pxa-B, Pxa-G, and Pxa-R may also have respective patterned light emitting layers EML, and in this case, the light emitting elements corresponding to the first to third pixel regions Pxa-B, Pxa-G, and Pxa-R may generate light having mutually different colors. In this case, the light control layer CCL may be omitted.

The encapsulation member TFE may be disposed on the light emitting element LED and encapsulate the light emitting element LED. The encapsulation member TFE may include an inorganic film IL that is disposed on the outermost periphery thereof. The encapsulation member TFE may further include an organic film OL, or have a structure in which one or more inorganic films IL and one or more organic films OL are alternately repeated. The encapsulation member TFE may protect the light emitting element LED from water/oxygen and foreign substances such as particles.

In an embodiment, the inorganic film IL of the encapsulation member TFE may include a material that protects the light emitting element LED thereunder without particular limitation. For example, the inorganic film IL may include silicon nitride ($SiN_x$), silicon oxynitride ($SiO_yN_x$), silicon oxide ($SiO_y$), titanium oxide ($TiO_y$), aluminum oxide ($AlO_y$), or the like.

The organic film OL of the encapsulation member TFE may include an organic material based on acylate, but the embodiment of the inventive concept is not particularly limited thereto. The inorganic film IL may be formed through a deposition method or the like, and the organic film OL may be formed through a deposition method, coating method, or the like.

The display panel DP according to an embodiment of the inventive concept includes the light shield pattern BP that is disposed on the encapsulation member TFE. The light shield pattern BP may be disposed without overlapping the first to third pixel regions Pxa-B, Pxa-G, and Pxa-R while overlapping the peripheral region NPxa when viewed in a plan view. The light shield pattern BP may be patterned to overlap each of the peripheral regions NPxa. The light shield pattern BP may be covered by the filling layer BFL.

The display panel DP according to an embodiment of the inventive concept may include the light control layer CCL. The light control layer CCL may be disposed on the display element layer DP-LED. The light control layer CCL may be disposed on a plurality of light emitting elements LED and be spaced apart from the encapsulation member TFE with the filling layer BFL interposed therebetween.

The light control layer CCL may include: a first light control part CCP1 that transmits first color light; a second light control part CCP2 that converts the first color light into second color light; and a third light control part CCP3 that converts the first color light into third color light. For example, the second color light may be green light, and the green light may correspond to light with a wavelength range of about 500 nm to about 570 nm inclusive. The third color light may be red light and may correspond to light with a wavelength range of about 625 nm to about 675 nm inclusive.

According to one embodiment, the second light control part CCP2 and the third light control part CCP3 may include light emitting bodies. The light emitting bodies may be particles that convert the wavelength of incident light to a different wavelength. In an embodiment, the light emitting bodies included in the second light control part CCP2 and the third light control part CCP3 may be quantum dots.

The quantum dots are materials having crystal structures of several nanometers and including several hundreds to several thousands of atoms, and exhibit a quantum confinement effect in which an energy band gap increases due to their small size. When light having a wavelength with higher energy than the band gap is incident to the quantum dots, the quantum dots absorb the light and transit to an excited state, and falls to a ground state while emitting light having a specific wavelength. The wavelength of the emitted light may correspond to the band gap. The quantum dots may adjust the light emitting characteristics due to the quantum confinement effect by adjusting the size and composition thereof.

The core of the quantum dot may be selected from among group II-VI compounds, group III-V compounds, group IV-VI compounds, group IV elements, group IV compounds, or any combination thereof.

The group II-VI compounds may be selected from: binary compounds including, but not limited to, CdSe, CdTe, ZnS, ZnSe, ZnTe, ZnO, HgS, HgSe, HgTe, MgSe, MgS, and a mixture thereof; tertiary compounds including, but not limited to, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and quaternary compounds including, but not limited to, HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compounds may be selected: binary compounds including, but not limited to, GaN, GaP, GaAs, GaSb, AN, AlP, AlAs, AlSb, InN, InP, InAs, InSb, and a mixture thereof; tertiary compounds including, but not limited to, GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and quaternary compounds including, but not limited to, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compounds may be selected: binary compounds including, but not limited to, SnS, SnSe, SnTe, PbS, PbSe, PbTe, and a mixture thereof; tertiary compounds including, but not limited to, SnSeS, SnSeTe, SnSTe, PbSeS, PbSeTe, PbSTe, SnPbS, SnPbSe, SnPbTe, and a mixture thereof; and quaternary compounds including, but not limited to, SnPbSSe, SnPbSeTe, SnPbSTe, and a mixture thereof. The group IV element may be selected from the group including, but not limited to, Si, Ge, and a mixture thereof. The group IV compound may be a binary compound selected from the group including, but not limited to, SiC, SiGe, and a mixture thereof.

According to one embodiment, the binary compound, the tertiary compound, or the quaternary compound may be present inside particles at a uniform concentration, or be divided into states, in which concentration distributions are partially different, to be present inside the same particles. In addition, the quantum dots may have a core/shell structure in which a single quantum dot surrounds another quantum dot. The interface between a core and a shell may have a concentration gradient such that the closer to the center thereof, the lower the concentration of an element present in the shell.

In several embodiments, the quantum dots may have a core/shell structure in which a core includes the abovementioned nanocrystal, and a shell surrounds the core. The shell of the quantum dots in the core-shell structure may serve as a protective layer for maintaining the semiconductor characteristics by preventing chemical modification of the core and/or a charging layer for imparting an electrophoretic characteristic to the quantum dots. The shell may be a single layer or a multilayer. The interface between the core and the shell may have a concentration gradient such that the closer to the center thereof, the lower the concentration of an element present in the shell. Examples of the shell of quantum dots in the core-shell structure may include oxides of metal or non-metal, semiconductor compounds, and any combination thereof.

For example, the oxides of metal or non-metal may include binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or tertiary compounds such as $MgAl_2O_4$, $CoFe_2O_4$, $NiFe_2O_4$, and $CoMn_2O_4$, but the embodiment of the inventive concept is not limited thereto.

In addition, the semiconductor compounds may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the embodiment of the inventive concept is not limited thereto.

According to one embodiment, the quantum dots may have a full width of half maximum (FWHM) of a light emitting wavelength spectrum of about 45 nm or less, for example, about 40 nm or less, or, about 30 nm or less, and may enhance color purity or color reproductivity. In addition, the quantum dots may emit the light in all directions, and thus, light viewing angle of the display panel DP may be improved.

In addition, the forms and shapes of the quantum dots are not particularly limited and may have various forms and shapes such as nanoparticles, nanotubes, nanowires, nanofibers, nano-plate-shaped particles which have spherical, pyramidal, multi-arm, and cubic shapes.

The emitted light from the quantum dots may be adjusted according to the sizes of the particles, and thus, the quantum dots may emit light of various colors such as blue, red, or green. The smaller the particle sizes of the quantum dots, the shorter the wavelength range of the emitted light. For example, the particle size of the quantum dots that emits green light may be smaller than the particle size of the quantum dots that emits red light. In addition, the particle size of the quantum dots that emits blue light may be smaller than the particle size of the quantum dots that emits green light.

For example, the particle size of the quantum dots included in the second light control part CCP2 may be smaller than the particle size of the quantum dots included in the third light control part CCP3. In this case, the quantum dots included in the second light control part CCP2 may emit light having a shorter wavelength than the wavelength of the quantum dots included in the third light control part CCP3.

In an embodiment, the light control layer CCL may include a base resin. The light control layer CCL may further include scattering particles in addition to the light emitting bodies. The light emitting bodies and the scattering particles may be included or concentrated only in a portion of the light control layer CCL. In an embodiment, the first light control part CCP1 includes only scattering particles without including any light emitting bodies, and the second light control part CCP2 and the third light control part CCP3 respectively include both light emitting bodies and scattering particles.

As described above, the light control layer CCL may include a plurality of light control parts including the first light control part CCP1, the second light control part CCP2, and the third light control part CCP3. In an embodiment, each of the first light control part CCP1, the second light control part CCP2, and the third light control part CCP3 may be disposed to be spaced apart from each other when viewed in a plan view. Each of the first light control part CCP1, the second light control part CCP2, and the third light control part CCP3 may be arranged to be spaced apart from each other on a plane defined by an axis in the first direction DR1 and another axis in the third direction DR3.

The first light control part CCP1 may be disposed corresponding to the first pixel region Pxa-B, the second light control part CCP2 may be disposed corresponding to the second pixel region Pxa-G, and the third light control part CCP3 may be disposed corresponding to the third pixel region Pxa-R.

FIG. 4A illustrates that the first light control part CCP1, the second light control part CCP2, and the third light control part CCP3 have the same area and/or thickness as each other, but the embodiment of the inventive concept is not limited thereto, and the first light control part CCP1, the second light control part CCP2, and the third light control part CCP3 may have mutually different areas and/or thicknesses. For example, the third light control part CCP3 may have a larger area than the first light control part CCP1 and the second light control part CCP2. The first light control part CCP1 may have a smaller area than the second light control part CCP2 and the third light control part CCP3.

Referring to FIGS. 4A and 4B, the second light control part CCP2 included in the light control layer CCL may include light emitting bodies EP, scattering particles SC, and a base resin BR.

The base resin BR is a medium in which light emitting bodies EP are dispersed, and may include various resin compositions that are generally referred to as a binder in the pertinent art. However, the embodiment of the inventive concept is not limited thereto. For example, throughout the present disclosure, as long as the medium may disperse the light emitting bodies EP, the medium may be referred to as the base resin BR regardless of the name thereof, additional functions or characteristics, constituent materials, or the like. In one embodiment, the base resin may be a polymer resin. For example, the base resin may be an acryl-based resin, a urethane-based resin, a silicon-based resin, an epoxy-based resin, or the like. The base resin may be a transparent resin.

The light emitting body EP may be a particle that converts the wavelength of incident light to a different wavelength. In an embodiment, the light emitting body EP may be a quantum dot.

The light emitting body EP may be a particle that converts a wavelength of the first color light into a wavelength of the second color light. In an embodiment, the light emitting body EP may be a quantum dot that converts blue light into green light. The light emitting bodies EP may be uniformly dispersed inside the second light control part CCP2.

The scattering particles SC may be TiO2, silica-based nanoparticles, or the like. The scattering particles SC may scatter light. In another embodiment of the inventive concept, the scattering particles SC may be omitted.

A separation wall section WP may be disposed between the first light control part CCP1 and the second light control part CCP2 that are spaced apart from each other, and between the second light control part CCP2 and the third light control part CCP3 that are spaced apart from each other. The separation wall section WP may overlap the peripheral region NPxa when viewed in a plan view. The separation wall section WP may prevent a light leakage phenomenon and provide the boundary between the adjacent light control parts CCP1, CCP2, and CCP3. The separation wall section WP may include an organic light shielding material including a black pigment or dye. The separation wall section WP may include an organic material having hydrophobicity. In an embodiment, the separation wall section WP may be omitted.

In an embodiment, the display panel DP may include the color filter layer CFL. The color filter layer CFL may be disposed on the light control layer CCL and include first to third color filter parts CF-B, CF-G, and CF-R and a light shield member BM.

In an embodiment, the first to third color filter parts CF-B, CF-G, and CF-R may be spaced apart from each other when viewed in a plan view. Referring to FIG. 4A, the first to third color filter parts CF-B, CF-G, and CF-R may be spaced apart from each other in the first direction DR1.

The first to third color filter parts CF-B, CF-G, and CF-R may transmit light of wavelengths that are different from each other. The first color filter part CF-B may be disposed corresponding to the first light control part CCP1 and transmit the first color light, the second color filter part CF-G may be disposed corresponding to the second light control part CCP2, block the first color light, and transmit the second color light, and the third color filter part CF-R may be disposed corresponding to the third light control part CCP3, block the first color light, and transmit the third color light. The display panel DP including the color filter layer CFL may effectively reduce external reflection and prevent color mixing between the adjacent pixel regions.

In an embodiment, the pixel defining film PDL of the display element layer DP-LED may include a blue color material, and particularly include the same material as the first color filter part CF-B. The pixel defining film PDL may include a blue organic material. The pixel defining film PDL may further include a black dye or pigment. Specifically, the pixel defining film PDL may include a material such as carbon black or aniline black.

In an embodiment, the light shield pattern BP disposed on the encapsulation member TFE may include a red color material, and particularly, include the same material as the third color filter part CF-R. The light shield pattern BP may include a red organic material.

The light shield member BM may be provided corresponding to the peripheral region NPxa. The light shield member BM may include an organic light shielding material such as a black pigment or dye, or an inorganic light shielding material. The light shield member BM may prevent a light leakage phenomenon and provide the boundary between the adjacent color filter parts. At least a portion of the light shield member BM may be disposed to overlap an adjacent color filter part. For example, on a plane defined by an axis in the first direction DR1 and another axis in the third direction DR3, the light shield member BM may at least partially overlap the color filters adjacent thereto in the thickness direction. FIG. 4A exemplarily illustrates that the light shield member BM entirely overlaps the separation wall section WP in the thickness direction. The thickness of the light shield member BM is the same as the thickness of the entirety of the color filter layer CFL, but the embodiment of the inventive concept is not limited thereto, and the thickness of the light shield member BM may be smaller than the thickness of the entirety of the color filter layer CFL. An embodiment of the inventive concept discloses the light shield member BM included in the color filter layer CFL, but the embodiment of the inventive concept is not limited thereto, and the light shield member BM may be omitted.

In an embodiment, the filling layer BFL may be filled between the encapsulation member TFE and the light control layer CCL. The filling of the filling layer BFL between the encapsulation member TFE and the light control layer CCL may indicate that the space between the encapsulation member TFE and the light control layer CCL is filled with the filling layer BFL so that no inner space or gap remains between the encapsulation member TFE and the light control layer CCL. The filling layer BFL may entirely cover the light shield pattern BP as well as a portion of the upper surface of the encapsulation member TFE and the light control layer CCL come into contact with each other.

The filling layer BFL may prevent the light emitting bodies EP and/or scattering particles SC included in the light control layer CCL from being oxidized by air, and thus, light extraction efficiency of the display panel DP may be maintained within a tolerable range without a large change.

In an embodiment, the filling layer BFL may directly be disposed on the inorganic film IL disposed on the outermost periphery of the encapsulation member TFE. The filling layer BFL may include an inorganic binder, an organic binder, or a liquid crystal compound, but the embodiment of the inventive concept is not limited thereto.

Figure 5A:
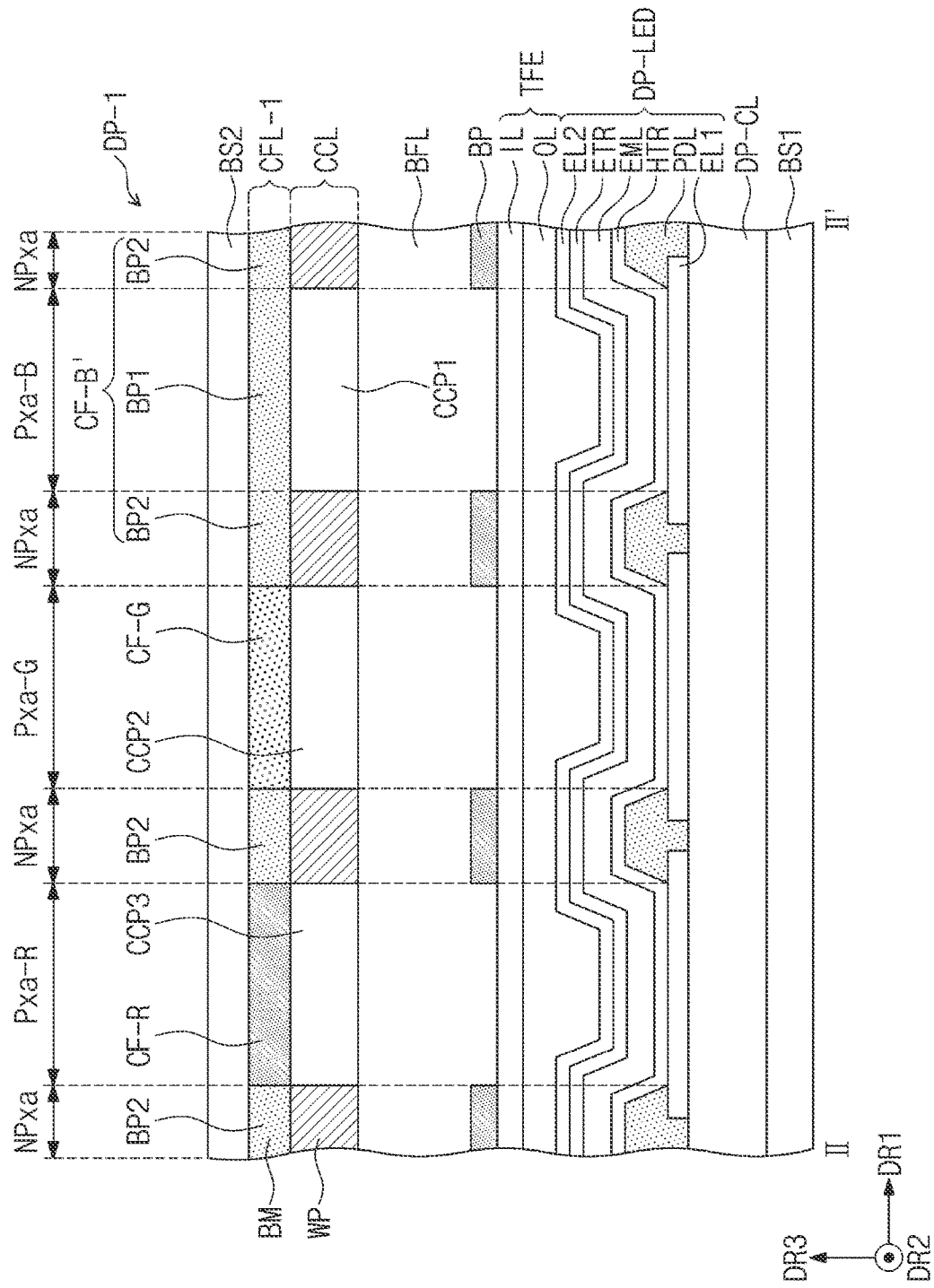
FIG. 5A is a cross-sectional view of a display panel according to an embodiment of the inventive concept.
Figure 5B:
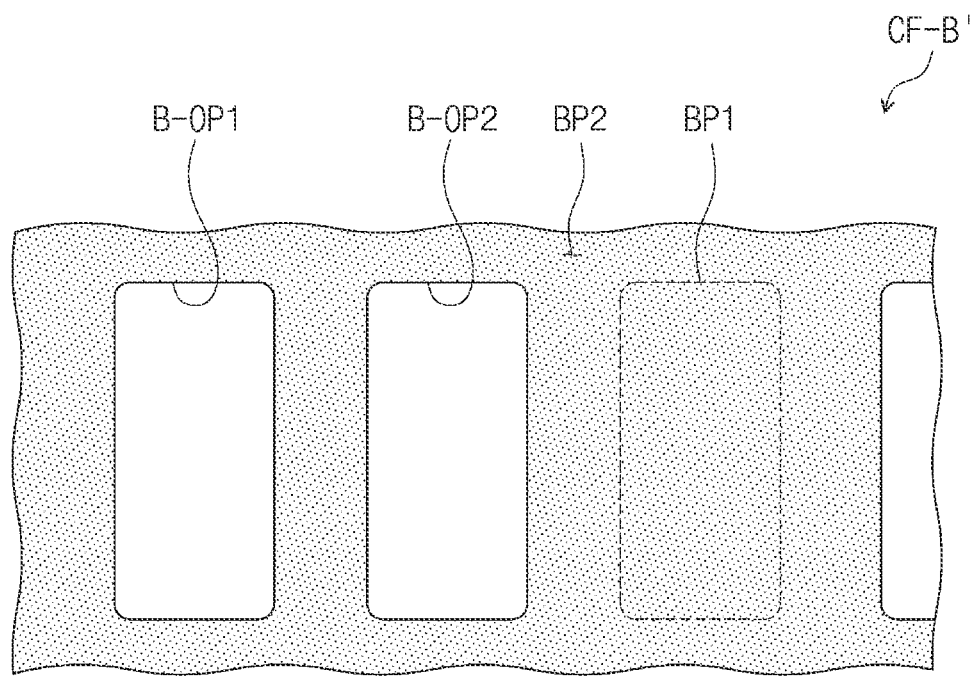
FIGS. 5B and 5C are plan views of stacked structures of an upper display substrate according to an embodiment of the inventive concept.
Figure 5C:
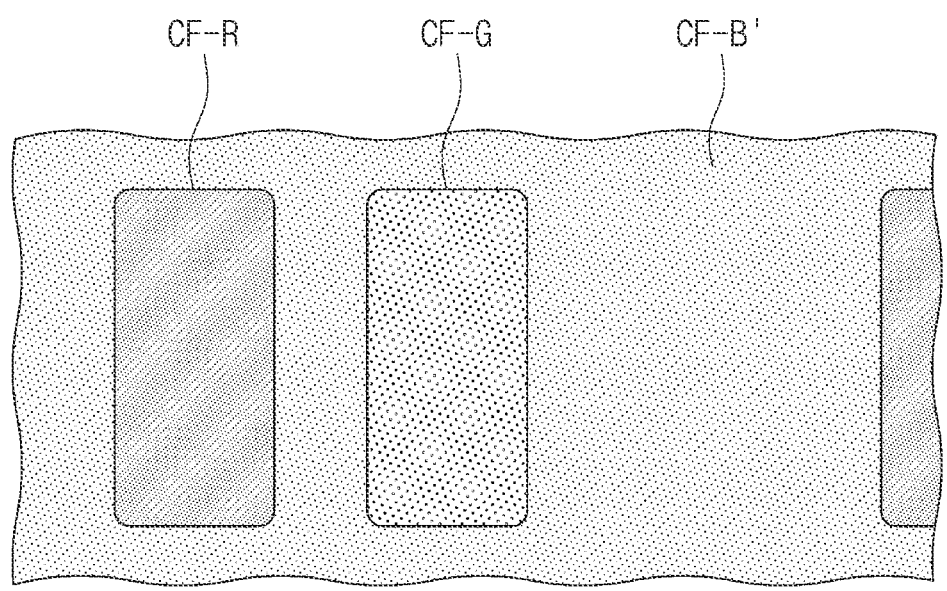

FIG. 5A is a cross-sectional view of a display panel according to an embodiment of the inventive concept. FIGS. 5B and 5C are plan views of stacked structures of an upper display substrate according to an embodiment of the inventive concept. Specifically, FIG. 5A is a cross-sectional view taken along line II-II' of FIG. 3A, and FIGS. 5B and 5C illustrate a portion/the entirety of components included in the color filter layer in the upper display substrate. Hereinafter, in describing the display panel of an embodiment with reference to FIGS. 5A to 5C, the same reference numerals as applied to the components described above, and the description thereon will not be provided.

As shown in FIG. 5A, an upper display substrate in a display panel DP-1 may include: a second base substrate BS2; first to third color filter parts CF-B', CF-G and CF-R disposed on the lower surface of the second base substrate BS2; and first to third light control layers CCP1, CCP2, and CCP3.

A third pixel region Pxa-R and a second pixel region Pxa-G may substantially be defined by a first opening B-OP1 and a second opening B-OP2 of the first color filter part CF-B' shown in FIG. 5B. The first color filter part CF-B' may directly be disposed on the lower surface of the second base substrate BS2.

As shown in FIGS. 5A and 5B, the first color filter part CF-B' may overlap the first pixel region Pxa-B and further overlap a peripheral region NPxa adjacent thereto. The first color filter part CF-B' may be divided into a filter portion BP1 serving as a color filter and a light shield portion BP2 serving as a light shield pattern. After forming a blue colored organic layer on one surface of the second base substrate BS2, the organic layer is exposed and developed, and thus, the first color filter part CF-B' having the first and second openings B-OP1 and B-OP2 may be formed. Accordingly, the filter portion BP1 and the light shield portion BP2 may have an integrated shape.

Respective portions of the second color filter part CF-G and the third color filter part CF-R may directly be disposed on the lower surface of the second base substrate BS2. As shown in FIGS. 5B and 5C, the second color filter part CF-G may overlap the second opening B-OP2, and the third color filter part CF-R may overlap the first opening B-OP1. The second color filter part CF-G and the third color filter part CF-R may or may not overlap each other when viewed in a plan view.

Although not shown, another portion of each of the second color filter part CF-G and the third color filter part CF-R may at least partially overlap the first color filter part CF-B'. That is, a portion of the first color filter part CF-B' may be disposed between the lower surface of the second base substrate BS2 and the second color filter part CF-G, and another portion of the first color filter part CF-B' may be disposed between the lower surface of the second base substrate BS2 and the third color filter part CF-R.

FIG. 6 is a cross-sectional view of a display panel according to an embodiment of the inventive concept. Specifically, FIG. 6 is a cross-sectional view taken along line II-II' of FIG. 3A. Hereinafter, in describing the display panel of an embodiment with reference to FIG. 6, the same reference numerals are applied to the components described above, and the description thereon will not be provided.

Referring to FIG. 6, a display panel DP-2 according an embodiment of the inventive concept may further include one or more capping layers CAP1 and CAP2.

In an embodiment, the capping layers CAP1 and CAP2 may be disposed between a light control layer CCL and a filling layer BFL and/or between the light control layer CCL and a color filter layer CFL. In an embodiment, the first capping layer CAP1 may be disposed on the upper surface of the light control layer CCL, that is, between the light control layer CCL and the color filter layer CFL, and the second capping layer CAP2 may be disposed on the lower surface of the light control layer CCL, that is, between the light control layer CCL and the filling layer BFL. The second capping layer CAP2 may come into contact with the light control layer CCL. Each of the capping layers CAP1 and CAP2 may be composed of an inorganic material, and the types of the inorganic material are not particularly limited. The capping layers CAP1 and CAP2 may be disposed to surround the light control layer CCL and protect the light control layer CCL. In an embodiment, the light control layer CCL may have a structure in which upper and lower portions thereof are covered by the capping layers CAP1 and CAP2.

According to an embodiment of the inventive concept, a light shield pattern is included on light emitting elements included in a display panel, and the light shield pattern may include a material having a color that is different from the color of the light generated by the light emitting elements. Accordingly, external reflection may be effectively reduced while preventing color mixing, and thus, the light efficiency of the display panel may be enhanced.

Various exemplary embodiments of the inventive concept have been described herein, but it will be apparent to those skilled in the art or those having general knowledge in the art that various modifications and variations can be made without departing from the spirit and scope of the present disclosure encompassing appended claims and their equivalents.

Hence, the technical scope of the present disclosure shall not be restricted by the contents described in the detailed description but be determined by the claims.

What is claimed is:

1. A display panel comprising:
    a base substrate including a plurality of pixel regions and a peripheral region adjacent to the plurality of pixel regions;
    a pixel defining film disposed on the base substrate and having a plurality of openings, each of the plurality of openings corresponding to a respective one of the plurality of pixel regions;
    a plurality of light emitting elements disposed on the base substrate corresponding to the plurality of openings and configured to generate first color light having a first color;
    an encapsulation layer disposed on the plurality of light emitting elements;
    a light shield pattern disposed on the encapsulation layer and overlapping the peripheral region when viewed in a plan view; and
    a light control layer disposed on the encapsulation layer and the light shield pattern, the light control layer including a separation wall section spaced apart from the light shield pattern and overlapping the light shield pattern when viewed in a plan view and a plurality of light control parts disposed in regions corresponding to the plurality of pixel regions,
    wherein the light shield pattern comprises a second material having a second color that is different from the first color.

2. The display panel of claim 1, wherein the light shield pattern comprises a black material.

3. The display panel of claim 1, wherein the first color is a blue color and the second color is a black color.

4. The display panel of claim 1, wherein the plurality of light control parts comprise:
    a first light control part configured to transmit the first color light; and
    a third light control part configured to convert the first color light into third color light having a third color that is different from the first color and the second color.

5. The display panel of claim 4, further comprising a color filter layer disposed on the light control layer,
    wherein the plurality of pixel regions comprises:
    a first pixel region overlapping the first light control part when viewed in the plan view; and
    a third pixel region overlapping the third light control part when viewed in the plan view, and wherein the color filter layer comprises:
a first color filter part overlapping the first pixel region and the peripheral region when viewed in the plan view and having an opening defined therein corresponding to the third pixel region; and
a third color filter part overlapping the third pixel region when viewed in the plan view.

6. The display panel of claim 5, further comprising a filling layer disposed between the encapsulation layer and the light control layer,
wherein the light shield pattern is covered by the filling layer.

7. The display panel of claim 5, further comprising a capping layer disposed at least between the light control layer and the plurality of light emitting elements or between the light control layer and the color filter layer.

8. The display panel of claim 4, wherein the first color light has a first wavelength range of about 410 nm to about 480 nm, and the third color light has a third wavelength range of about 625 nm to 675 nm.

9. The display panel of claim 1, wherein the light control layer comprises: a base resin; light emitting bodies dispersed in the base resin; and scattering bodies dispersed in the base resin.

10. The display panel of claim 1, wherein the light shield pattern is spaced apart from the light control layer in a cross-sectional view.

11. The display panel of claim 1, wherein each of the plurality of light emitting elements comprises a first electrode, a second electrode, and a light emitting layer disposed between the first electrode and the second electrode, and wherein the light emitting layer of the plurality of light emitting elements having an integrated shape.

12. A display panel comprising:
a base substrate including a plurality of pixel regions and a peripheral region adjacent to the plurality of pixel regions;
a plurality of light emitting elements disposed on the base substrate and overlapping the plurality of pixel regions when viewed in a plan view and configured to generate blue light;
an encapsulation layer covering the plurality of light emitting elements;
a light shield pattern disposed on the encapsulation layer and overlapping the peripheral region when viewed in the plan view;
a filling layer covering the light shield pattern; and
a light control layer disposed on the filling layer and overlapping the plurality of pixel regions, the light control layer including a separation wall section spaced apart from the light shield pattern and overlapping the plurality of light shield patterns when viewed in a plan view and a plurality of light control parts disposed in regions corresponding to the plurality of pixel regions,
wherein the light shield pattern comprises a black color material.

* * * * *